US007327910B2

(12) United States Patent
Forrest et al.

(10) Patent No.: US 7,327,910 B2
(45) Date of Patent: Feb. 5, 2008

(54) TWIN WAVEGUIDE BASED DESIGN FOR PHOTONIC INTEGRATED CIRCUITS

(75) Inventors: Stephen R. Forrest, Princeton, NJ (US); Milind Gokhale, Princeton, NJ (US); Pavel Studenkov, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 58 days.

(21) Appl. No.: 10/983,366

(22) Filed: Nov. 8, 2004

(65) Prior Publication Data
US 2005/0094924 A1    May 5, 2005

Related U.S. Application Data

(63) Continuation of application No. 10/642,316, filed on Aug. 15, 2003, now Pat. No. 6,819,814, which is a continuation of application No. 09/982,001, filed on Oct. 18, 2001, now Pat. No. 7,302,124, which is a continuation of application No. 09/337,785, filed on Jun. 22, 1999, now Pat. No. 6,381,380.

(60) Provisional application No. 60/090,451, filed on Jun. 24, 1998.

(51) Int. Cl.
*G02B 6/12* (2006.01)
*H01S 5/00* (2006.01)
*H04B 10/04* (2006.01)
*H04B 10/12* (2006.01)

(52) U.S. Cl. .......................... 385/14; 385/28; 398/200; 372/43.01; 372/50.1

(58) Field of Classification Search ............ 385/10–14, 385/28, 43, 50, 8, 9, 147; 372/44–46, 39, 372/43.01, 46.01, 50.1; 359/344, 121–124; 398/182, 200, 201
See application file for complete search history.

(56) References Cited

U.S. PATENT DOCUMENTS 5,039,189 A    8/1991    Lytel et al. ................... 385/2
(Continued)

FOREIGN PATENT DOCUMENTS

CN           1118527         3/1996
(Continued)

OTHER PUBLICATIONS

Forrest, S.R., et al., "Integrated photonics using asymmetric twin-waveguide structures," *IEEE*, 2000, 13-16.
(Continued)

*Primary Examiner*—Kevin S. Wood
(74) *Attorney, Agent, or Firm*—Woodcock Washburn LLP

(57) ABSTRACT

An asymmetric twin waveguide (ATG) structure is disclosed that significantly reduces the negative effects of inter-modal interference in symmetric twin-waveguide structures and which can be effectively used to implement a variety of optical devices. The ATG structure of the invention can be monolithically fabricated on a single epitaxial structure without the necessity of epitaxial re-growth. To achieve the ATG structure of the invention, the effective index of the passive waveguide in the ATG is varied from that of a symmetric twin waveguide such that one mode of the even and odd modes of propagation is primarily confined to the passive waveguide and the other to the active waveguide. The different effective indices of the two coupled waveguides result in the even and odd modes becoming highly asymmetric. As a result, the mode with the larger confinement factor in the active waveguide experiences higher gain and becomes dominant. In a further embodiment, the active waveguide is tapered to reduce coupling losses of the optical energy between the passive waveguide and the active waveguide. In a further embodiment, a grating region is incorporated atop the passive waveguide to select certain frequencies for transmission of light through the passive waveguide.

15 Claims, 3 Drawing Sheets

U.S. PATENT DOCUMENTS

| | | | |
|---|---|---|---|
| 5,078,516 A | 1/1992 | Kapon et al. | 385/129 |
| 5,140,149 A | 8/1992 | Sakata et al. | 250/211 J |
| 5,208,878 A | 5/1993 | Thulke | 385/14 |
| 5,325,379 A | 6/1994 | Amann | 372/20 |
| 5,355,386 A | 10/1994 | Rothman et al. | 372/50 |
| 5,499,259 A | 3/1996 | Makita | 372/45 |
| 5,500,867 A | 3/1996 | Krasulick | 372/38.02 |
| 5,509,094 A | 4/1996 | Minami et al. | 385/29 |
| 5,511,084 A | 4/1996 | Amann | 372/20 |
| 5,568,311 A | 10/1996 | Matsumoto | 359/344 |
| 5,574,742 A | 11/1996 | Ben-Michael et al. | 372/45 |
| 5,623,363 A | 4/1997 | Liou | 359/344 |
| 5,663,824 A | 9/1997 | Koch et al. | 359/184 |
| 5,708,671 A | 1/1998 | Siao et al. | 372/20 |
| 5,715,268 A | 2/1998 | Lang et al. | 372/50 |
| 5,721,750 A | 2/1998 | Kwon et al. | 372/44 |
| 5,852,687 A | 12/1998 | Wickham | 385/14 |
| 5,859,866 A | 1/1999 | Forrest et al. | 372/50 |
| 5,917,967 A | 6/1999 | Dubey et al. | 385/14 |
| 5,985,685 A | 11/1999 | Lealman et al. | 438/31 |
| 6,031,851 A | 2/2000 | Shimizu et al. | 372/18 |
| 6,051,445 A | 4/2000 | Dubey et al. | 438/31 |
| 6,167,073 A | 12/2000 | Botez et al. | 372/46 |
| 6,198,863 B1 | 3/2001 | Lealman et al. | 385/37 |
| 6,215,295 B1 | 4/2001 | Smith, III | 324/95 |
| 6,240,233 B1 | 5/2001 | Weinert et al. | 385/131 |
| 6,246,965 B1 | 6/2001 | Cockerham et al. | 702/85 |
| 6,310,995 B1 | 10/2001 | Saini et al. | 385/28 |
| 6,311,003 B1 | 10/2001 | Dubey et al. | 385/129 |
| 6,314,451 B1 | 11/2001 | Landsman et al. | 709/203 |
| 6,330,378 B1 | 12/2001 | Forrest et al. | 385/14 |
| 6,330,387 B1 | 12/2001 | Salamon et al. | 385/129 |
| 6,335,994 B1 | 1/2002 | Kato | 385/50 |
| 6,339,496 B1 | 1/2002 | Koley et al. | 359/344 |
| 6,381,380 B1* | 4/2002 | Forrest et al. | 385/14 |
| 6,483,863 B2 | 11/2002 | Forrest et al. | 372/50 |
| 6,490,044 B1 | 12/2002 | Koch et al. | 356/478 |
| 6,519,374 B1 | 2/2003 | Stook et al. | 385/2 |
| 6,668,103 B2 | 12/2003 | Hosoi | 385/2 |
| 6,795,622 B2 | 9/2004 | Forrest et al. | 385/50 |
| 6,819,814 B2* | 11/2004 | Forrest et al. | 385/14 |
| 2002/0018504 A1 | 2/2002 | Coldren | 372/50 |
| 2002/0031297 A1 | 3/2002 | Forrest et al. | 385/28 |
| 2002/0097941 A1 | 7/2002 | Forrest et al. | 385/1 |
| 2003/0012244 A1 | 1/2003 | Krasulick et al. | 372/50 |
| 2004/0096175 A1 | 5/2004 | Tolstikhin | 385/131 |

FOREIGN PATENT DOCUMENTS

| | | |
|---|---|---|
| EP | 0 263 640 | 4/1988 |
| FR | 2 337 449 | 7/1977 |
| GB | 2 105 863 A | 3/1983 |
| JP | 2000-228558 | 8/2000 |
| WO | WO 99/67665 | 12/1999 |
| WO | WO 03/007057 A2 | 1/2003 |
| WO | WO 03/102678 A1 | 12/2003 |

OTHER PUBLICATIONS

Bauer, J.G., et al., "High responsivity integrated tapered waveguide PIN photodiode," *Proceedings fo the European Conference on Optical Communication (ECOC)*, Sep. 12-16, 1993, vol. 2, Conf. 19, 277-280.

Dagenais, M., et al., "Alignment tolerant lasers and silicon waferboard integration," *Passive Alignment Techniques for Optoelectronic Transmitter Arrays*, http:www.eeumd.edu/photonics/papers/spie/SPIE97.htm, 1997, 14 pages.

Dagenais, M., et al., "Complex needs drive optoelectronic integration," *Optoelectronics World*, Jul. 1998, 157-160.

Saini, S.S., et al., "Compact mode expanded lasers using resonant coupling between a 1.55-µm InGaAsP tapered active region and an underlying coupling waveguide," *IEEE Photonics Technology Letters*, Sep. 1998, 10(9), 1232-1234.

Saini, S.S., et al., "Compact low-loss vertical resonant mode coupling between two well-confined waveguides," *Electronics Letts.*, 1999, 35(14), 2 pages.

Saini, S.S., et al., "Passive active resonant coupler (PARC) platform with mode expander," *IEEE Photonics Techn. Letts.*, 2000, 12(8), 1025-1027.

Studenkov, P.V., et al., "Efficient Coupling in Integrated Twin-Waveguide Lasers Using Waveguide Tapers", *IEEE Photonics Technology Letters*, vol. 11, No. 9, pp. 1096-1098, (1999).

Studenkov, P.V., et al., "Asymmetric Twin-Waveguide 1.55-µm Wavelength Laser with a Distributed Bragg Reflector", *IEEE Photonics Technology Letters*, vol. 12, No. 5, pp. 468-470, (2000).

Studenkov, P.V., et al., "Monolithic Integration of a Quantum-Well Laser and an Optical Amplifier Using an Asymmetric Twin-Waveguide Structure", *IEEE Photonics Technology Letters*, vol. 10, No. 8, pp. 1088-1090, (1998).

Vusirikala, V., et al., "1.55- µm InGaAsP—InP laser arrays with integrated-mode expanders fabricated using a single epitaxial growth," *IEEE J. Selected Topics in Quantum Electronics*, Dec. 1997, 3(6), 1332-1343.

Fredkin, E., et al., "Conservative Logic," *Int. J. Theor. Phys.*, 1982, 21(3/4), 219-253.

Alferness, R.C., et al., "Vertically coupled INGAASP/INP buried rib waveguide filter," *Applied Physics Letts.*, 1991, 59(20), 2573-2575.

Bach, L., et al., "Wavelength stabilized single-mode lasers by coupled micro-square resonators," *IEEE Photonics Techn. Letts.*, 2003, 15, 377-379.

Bennett, S., et al., "1.8-THz bandwidth, zero-frequency error, tunable optical comb generator for DWDM applications," *IEEE Photonics Techn. Letts.*, 1999, 11(5), 551-553.

Brückner, H.J., et al., "Taper-Waveguide integration for polarization insensitive InP/InGaAsP based optical amplifiers," *Electron. Lett.*, 1994, 30(16), 1290-1291.

Claasen, A., et al., "Comparison of diodes and resistors for measuring chip temperature during thermal characterization of electronic packages using thermal test chips," *IEEE 13th Ann. Semiconductor Thermal Measurement & Management Symposium*, 1997, 198-209.

"Coupled cavity modelocked lasers," *Applied Physics*, http://fb6www.uni-paderborn.de, downloaded Mar. 30, 2005, 3 pages.

"Current work on composite-resonator vertical-cavity lasers," *Coupled Cavity VCSELs*, http://vcsel.micro.uiuc.edu, downloaded Mar. 30, 2005, 4 pages.

den Besten, J.H., et al., "An integrated coupled-cavity 16-wavelength digitally tunable laser," *IPR*, 2002, 1-3.

Fredkin, E., et al., "Conservative logic," *Intern. J. of Theoretical physics*, 1982, 21(3/4, 219-253.

Gokhale, M.R., et al., "Uncooled, 10Gb/s 1310 nm electroabsorption modulated laser," presented at *OFC 2003* (PD-42), Atlanta, USA, 2003, 3 pages.

Hamamoto, et al., "Insertion-loss-free 2×2 InGaAsP/InP optical switch fabricated using bandgap energy controlled selective MOVPF," *Electron. Lett.*, 1995, 31(20), 1779-1781.

Hammond, B., et al., "Integrated wavelength locker for tunable laser applications," *15th Ann. Meeting of the IEEE Lasers & Electro-Optics Soc.*, 2002, 2, 479-480.

He, J.-J., et al., "Photonic integrated circuits and components using quantum well intermixing," *Integrated Optoelectronics, Proc. of SPIE*, 1996, 2891, 2-9.

Johnson, J.E., et al., "Fully stabilized electroabsorption-modulated tunable DBR laser transmitter for long-haul optical communications," *IEEE J. on Selected Topics in Quantum Electronics*, 2001, 7, 168-177.

Kanjamala, A.P., et al., "Wavelength switching in multicavity lasers," *Am. Inst. Of Physics*, 1997, 71(3), 300-302.

Newkirk, M.A., et al., "1.55 μm multiquantum well semiconductor optical amplifier with low gain ripple and high coupling efficiency for photonic circuit integration," *Electron. Lett.*, 1993, 29(5), 443-444.

O'Dowd, R., et al, "Frequency plan and wavelength switching limits for widely tunable semiconductor transmitters," *IEEE J. Selected Topics in Quantum Electrons*, 2001, 7, 259-269.

Oh, K.R., et al., "Laser amplifier gate switch arrays using reactive ion etching," *Electron. Lett.*, 1996, 32(1), 39-40.

Rabus, D.G., et al., "MMI-coupled ring resonators in GaInAsP-InP," *IEEE Photonics Techn. Letts.*, 2001, 13, 812-814.

Rabus, D.G., et al., "Resonance frequency tuning of a double ring resonator in GaInAsP/InP: Experiment and simulation," *Jpn. J. Appl. Phys.*, 2002, 41, 1186-1189.

Rabus, D.G., et al., "High-Q channel-dropping filters using ring resonators with integrated SOAs," *IEEE Photonics Techn. Letts.*, 2002, 1, 1442-1444.

Sarlet, G., et al., "Control of widely tunable SSG-DBR lasers for dense wavelength division multiplexing," *IEEE J. Lightwave Techn.*, 2000, 18, 1128-1138.

Shi, H., et al., "Relative intensity noise measurements of a widely tunable sampled-grating DBR laser," *IEEE Photonics Techn. Letts.*, 2002, 14(6), 759-761.

Silva, C.F.C., et al., "A dense WDM source using optical frequency comb generation and widely tunable injection-locked laser filtering techniques," *IEE Prep., Conference on Postgraduate Research in Electronics, Photonics and Related Fields*, 2000, 497-500.

Studenkov, P.V., et al., "Monolithic integration of an all-optical Mach-Zehnder demultiplexer using an asymmetric twin-waveguide structure," *IEEE Photonics Techn. Lett.*, 2001, 13, 600-602.

Suematsu, Y., et al., "Integrated twin-guide AlGaAs laser with multiheterostructure," *IEEE J. Quantum Electron.*, 1973, QE-11(7), 457-460.

Tatsuno, K., et al., "50 GHz spacing, multi-wavelength tunable locker integrated in a transmitter module with a monolithic-modulator and a DFB-laser," *Optical Fiber Commun. Conf.*, 2001, TuB5-1-TuB5-4.

Utaka, K., et al., "Measurement of coupling coefficient and coupling length of GaAs/A1GaAs integrated twin-guide injection lasers prepared by liquid-phase epitaxy," *Trans. IECE Japan*, 1979, E-62, 319-323.

Van, V., et al., "Optical signal processing using nonlinear semiconductor microring resonators," *IEEE J. on Selected Topics in Quantum Electronics*, 2002, 8, 705-713.

Vusirikala, V., et al., "Compact mode expanders using resonant coupling between a tapered active region and an underlying coupling waveguide," *IEEE Photonics Techn. Letts.*, 1998, 10(2), 203-205.

Wang, H., et al., "A fully integratable, 1.55- μm wavelength, continuously tunable asymmetric twin-waveguide distributed bragg reflector laser," *IEEE Photonics Techn. Lett.*, 2003.

Wei, J., et al., "A high-responsivity high-bandwidth asymmetric twin-waveguide coupled InGaAs-InP-InAlAs avalanche photodiode," *IEEE Photonics Techn. Lett.*, 2002, 14, 1590-1592.

Woodward, S.L., et al., "RIN in multisection MQW-DBR lasers," *IEEE Photonics Technology Letts.*, 1990, 2, 104-108.

Woodward, S.L., et al., "A control loop which ensures high side-mode-suppression ratio in a tunable DBR laser," *IEEE Photonics Techn. Letts.*, 1992, 4, 417-419.

Xia, F.N., et al., "Monolithic integration of a semiconductor optical amplifier and a high bandwidth p-i-n photodiode using asymmetric twin-waveguide technology," *IEEE Photonics Techn. Lett.*, 2003, 15, 452-454.

Xu, L., et al., "Monolithic integration of an InGaAsl'-InP MQW laser/waveguide using a twin-guide structure with a mode selection layer," *IEEE Photon. Technol. Lett.*, 1997, 9, 569-571.

Yakoyama, Y., et al., "Multiwavelength locker integrated wide-band wavelength-selectable light source module," *IEEE Photonics Technollogy Letts.*, 2003, 15, 290-292.

U.S. Appl. No. 09/982,001, filed Oct. 2001, Forest.

Huang, Y., et al., "Reduction of absorption loss in asymmetric twin waveguide laser tapers using argon plasma-enhanced quantum-well intermixing," *IEEE Photonics Techn. Letts.*, 2004, 16(10), 2221-2223.

Tauke-Pedretti, A., et al., "High saturation power and high gain integrated photoreceivers," *IEEE Photonics Technology Letts.*, 2005, 17(10), 2167-2169.

* cited by examiner

TWIN WAVEGUIDE BASED DESIGN FOR PHOTONIC INTEGRATED CIRCUITS

CROSS-REFERENCE TO RELATED APPLICATIONS

This application is a continuation of U.S. patent application Ser. No. 10/642,316 filed Aug. 15, 2003 now U.S. Pat. No. 6,819,814 and entitled "Twin Waveguide Based Design for Photonic Integrated Circuits," which is a continuation of U.S. patent application Ser. No. 09/982,001 filed Oct. 18, 2001 and entitled "Twin Waveguide Based Design for Photonic Integrated Circuits," which is a continuation of U.S. patent application Ser. No. 09/337,785 filed Jun. 22, 1999 and entitled "Twin Waveguide Based Design for Photonic Integrated Circuits," now U.S. Pat. No. 6,381,380, which claims priority to U.S. Provisional Application 60/090,451 filed Jun. 24, 1998 and entitled "Twin Waveguide Based Design for Photonic Integrated Circuits," the contents of all of which are hereby incorporated by reference in their entirety.

GOVERNMENT LICENSE RIGHTS

The U.S. Government may have a paid-up license in this invention and the right in limited circumstances to require the patent owner to license others on reasonable terms as provided for by the terms of Grant Number F19628-94-C-0045 awarded by DARPA.

FIELD OF THE INVENTION

The present invention is related to the field of optical communications, and more particularly to waveguide design in photonic integrated circuits.

BACKGROUND OF THE INVENTION

Photonic integrated circuits (PIC) provide an integrated technology platform increasingly used to form complex optical circuits. The PIC technology allows many optical devices both active and passive, to be integrated on a single substrate. For example, PICs may comprise integrated lasers, integrated receivers, waveguides, detectors, semiconductor optical amplifiers (SOA), and other active and passive optical devices. Such monolithic integration of active and passive devices in PICs provides an effective integrated technology platform for use in optical communication.

A particularly versatile PIC platform technology is the integrated twin waveguide (TG) structure in which active and passive waveguides are combined in a vertical directional coupler geometry using evanescent field coupling. As is known, the TG structure requires only a single epitaxial growth step to produce a structure on which active and passive devices are layered and fabricated. That is, TG provides a platform technology by which a variety of PICs, each with different layouts and components, can be fabricated from the same base wafer. All of the integrated components are defined by post-growth patterning, eliminating the need for epitaxial regrowth. Additionally, the active and passive components in a TG-based PIC can be separately optimized with post-growth processing steps used to determine the location and type of devices on the PIC.

The conventional TG structure, however, suffers from the disadvantage that waveguide coupling is strongly dependent on device length, due to interaction between optical modes. A common problem in prior-art TG structure: is the relative inability to control the lasing threshold current and coupling to the passive waveguide as a consequence of the sensitivity to variations in the device structure itself. The sensitivity variations arise form the interaction between the even and the odd modes of propagation in the conventional TG structure. This interaction leads to constructive and destructive interference in the laser cavity, which affects the threshold current, modal gain, coupling efficiency and output coupling parameters of the device. It is noted that the threshold current represents the value above which the laser will lase, the modal gain is the gain achieved by traveling through the medium between the laser facets, and the coupling efficiency is the percentage of optical power transference between the active and passive regions in the optical device. In sum, the conventional TG structure suffers from unstable sensitivity in performance characteristics due to laser cavity length, even/odd mode interaction and variations in the layered structure.

A modified TG structure was disclosed in U.S. Pat. No. 5,859,866 to Forrest et al., which addressed some of the performance problems of the conventional TG structure by adding an absorption layer (or loss layer) between the upper and lower waveguides, thereby introducing additional loss to the even mode so that its interaction with the odd mode is attenuated. That patent, which includes common inventors with the invention described herein, is hereby incorporated by reference herein. The modified TG structure described in the '866 patent is designed to have relatively equal confinement factors for both the even and odd modes in each waveguide layer by constructing active and passive waveguides of equal effective indices of refraction. The resulting confinement factors are relatively the same because the even and odd optical modes are split relatively equally in the active and passive waveguides. The absorption layer in the modified TG structure suppresses lasing on the even mode, thereby making the TG coupling efficiency independent of laser cavity length. The absorption layer substantially eliminates the propagation of the even mode, while having minimal effect on the odd mode. With the substantial elimination of even-mode propagation by the absorptive layer, modal interaction is largely eliminated, resulting in optical power transfer without affecting performance parameter such as the threshold current, modal gain, coupling efficiency and output coupling.

However, the modified TG structure of the '866 patent is ineffective in a device with a traveling-wave optical amplifier (TWA), which is an important component in PICs designed for optical communication systems. In a TG device with an absorption layer operated as a TWA, the additional absorption in the single pass through the active region is insufficient to remove the even mode. It is desirable to have a common optical structure that can be effectively utilized for integrating both lasers and TWAs.

Therefore, there is a need in the art of optical communications to provide a relatively simple and cost-effective integration scheme for use with a traveling-wave optical amplifier (TWA).

There is a further need in the art to provide a twin waveguide (TG) structure that ensure stability in the laser and the traveling-wave optical amplifier (TWA).

There is a further need in the art to provide a TG structure that significantly reduces negative effects of modal interference without the concomitant coupling loss.

There is a further need in the art to provide a TG structure with the aforementioned that can be monolithically fabricated on a single epitaxial structure.

SUMMARY OF THE INVENTION

The invention provides an asymmetric twin waveguide (ATG) structure that significantly reduces the negative effects of modal interference and which can be effectively used to implement both lass and traveling-wave optical amplifiers (TWA). The ATG in the invention advantageously ensures stability in the laser and the TWA. In addition, the ATG provided in the invention can be monolithically fabricated on a single epitaxial structure without the necessity of epitaxial re-growth. Most importantly, the ATG, according to the present invention, is a versatile platform technology by which a variety of PICs, each with different layouts and components, can be fabricated from the same base wafer and modified with conventional semiconductor processing techniques to produce substantial modal gains and negligible coupling losses between PIC components.

In an embodiment of the ATG structure of the invention, the effective index of one of the passive waveguides in the ATG is varied from that of a symmetric twin waveguide such that one mode of the even and odd modes of propagation is primarily confined to the passive waveguide and the other to the active waveguide. As a result, the mode with the larger confinement factor in the active waveguide experiences higher gain and becomes dominant.

In an illustrative embodiment, monolithic integration of a 1.55 µm wavelength InGaAsP/InP multiple quantum well (MQW) laser and a traveling-wave optical amplifier (TWA) is achieved using the ATG structure of the invention. The laser and the amplifier shin the same strained InGaAsP MQW active layer grown by gas-source molecular beam epitaxy, while the underlying passive waveguide layer is used for on-chip optical interconnections between the active devices. In this particular embodiment, the passive waveguide has a higher effective index than the active waveguide, resulting in the even and odd modes becoming highly asymmetric. An appropriate combination of the thickness and index of refraction of the materials chosen for the waveguides results in modifying the effective index of refraction. The ATG structure uses the difference in modal gains to discriminate between the even and odd modes.

In a further embodiment, the active waveguide in a monolithically integrated device is laterally tapered by conventional semiconductor etching techniques. The tapered region of the active waveguide, at a junction of active and passive devices, helps to reduce coupling losses by resonant or adiabatic coupling of the optical energy between the passive waveguide and the active waveguide. As a result, the modal gain is significant compared to the symmetric TG structure and the coupling loss in the non-tapered ATG structure is reduced to negligible levels.

BRIEF DESCRIPTION OF THE DRAWINGS

A more complete understanding of the present invention may be obtained by considering the following description in conjunction with the drawings in which.

DETAILED DESCRIPTION

As already noted in the Background, the twin-waveguide approach to photonic integration represents a versatile platform technology by which a variety of PICs, each with different layouts and components, can be fabricated from the same base wafer—that wafer being grown in a single epitaxial growth step. Typically, the upper layer is used for active devices with gain (e.g., lasers SOAs), whereas the lower layer, with a larger bandgap energy, is used for on-chip manipulation of the optic energy generated by the active device(s) via etched waveguides. With such a TG structured PIC, active components such as semiconductor optical amplifiers (SOAs), Fabry-Perot and single frequency distributed Bragg reflector (DBR) lasers can be integrated with passive components such as Y-branches and multi-beam splitters, directional couplers, distributed Bragg feedback grating sections, multimode interference (MMI) couplers and Mach-Zehnder modulators.

As previously noted, the simple TG structured PIC suffers from a strong dependence between waveguide coupling and device length, due to the interaction between optical modes. For TG lasers, this problem has been addressed by the addition of an absorption layer between the upper and lower waveguides, as disclosed in cross-referenced U.S. Pat. No. 5,859,866. Such an inserted absorption layer introduces additional loss to the even mode, thereby attenuating its interaction with the odd mode. However, the loss layer concept cannot be effectively applied to a single-pass or traveling-wave optical amplifier (TWA), where both the even and odd modes must be considered. In a TG structure incorporating a TWA, the additional absorption in the single pass through the active region is insufficient to remove the even mode, since in a TWA, reflectivity is suppressed for both facets of the semiconductor laser.

Figure 1:
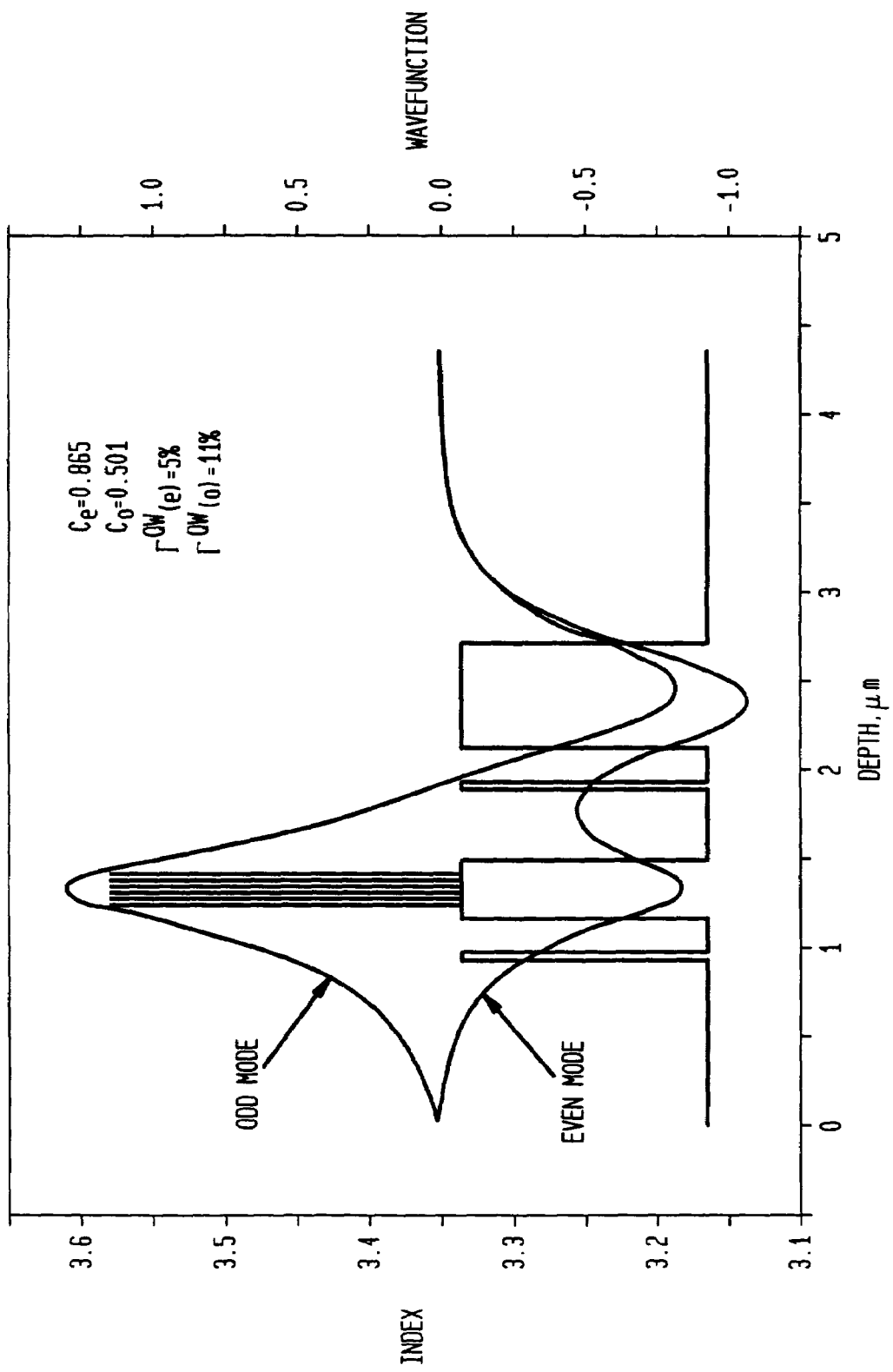
FIG. 1 is a refractive index profile of the even and the odd modes of the asymmetric twin waveguide (ATG) structure in accordance with the present invention.

Accordingly, a new, more advantageous approach to mode selection in a TG is disclosed herein—an asymmetric twin waveguide structure, which can be effectively utilized with a TWA and a laser. With a symmetric TG, as described above, equal confinement factors exist for both the even and odd modes in each waveguiding layer. This permits nearly complete power transfer between the guides and the maximum output coupling at an etched half-facet is 50 percent for either mode. With the asymmetric twin waveguide (ATG) structure of the invention, on the other hand, the effective index of the passive or active waveguide layer is changed relative to that used in a symmetric TG structure. As a result of differing effective indices of refraction the even and odd modes of propagation are split unequally between the waveguides. The unequal splitting is shown graphically in FIG. 1, which illustrates the modal intensity and refractive index profile of the ATG structure of the invention. As will be seen in the figure, in this particular case, the odd mode is primarily confined to the active waveguide, while the even mode is more strongly confined to the passive waveguide. The figure also shows, for an illusive embodiment of the invention described below, the calculated confinement factors for both modes in the quantum wells ($\Gamma^{QW}$) in the active waveguide, and their coupling coefficients to the passive waveguide ($C_o$, $C_e$ for odd and even modes, respectively).

With the ATG structure of the invention, the odd mode has higher gain and reflectivity at the etched facet, and therefore easily dominates in an ATG laser. Accordingly, for such an ATG laser, the absorption layer needed for the symmetric TG is not warranted. However, for a traveling wave optical amplifier (TWA) implemented in the ATG active waveguide, the situation is more complex, because both modes must be considered. As light enters the ATG TWA section, it splits between the even (e) and odd (o) modes with the amplitude coupling coefficients, $C_o$ and $C_e$ equal to the overlap integrals of the corresponding modes with the mode of the passive guide. The same coupling coefficients apply at the end of the TG section. Ignoring gain saturation effects, the total input-to-output electric-field transmission ratio is:

$$E_{out}/E_{in}=C_e^2\exp(\Gamma_e^{QW}gL/2)+C_o^2\exp(\Gamma_o^{QW}gL/2)\exp(i\Delta k\cdot L)$$

where g is the gain of the quantum well stack, L is the length of the TG section, and $\Delta k\cdot L$ is the phase difference between the even and odd modes at the amplifier output due to their slightly different propagation constants. For sufficiently large gL, the odd mode is amplified much more than the even, and dominate the TWA output regardless of phase. In this circumstance, the even mode can be ignored, and the input-to-output power gain is $$P_{out}/P_{in}=C_o^4\exp(\Gamma_o^{QW}gL).$$

Hence, the ATG structure of the invention uses gain, rather than a loss layer, to discriminate between the modes. This ensures stability of both ATG lasers and TWAs by reducing mode interference effects.

Figure 2:
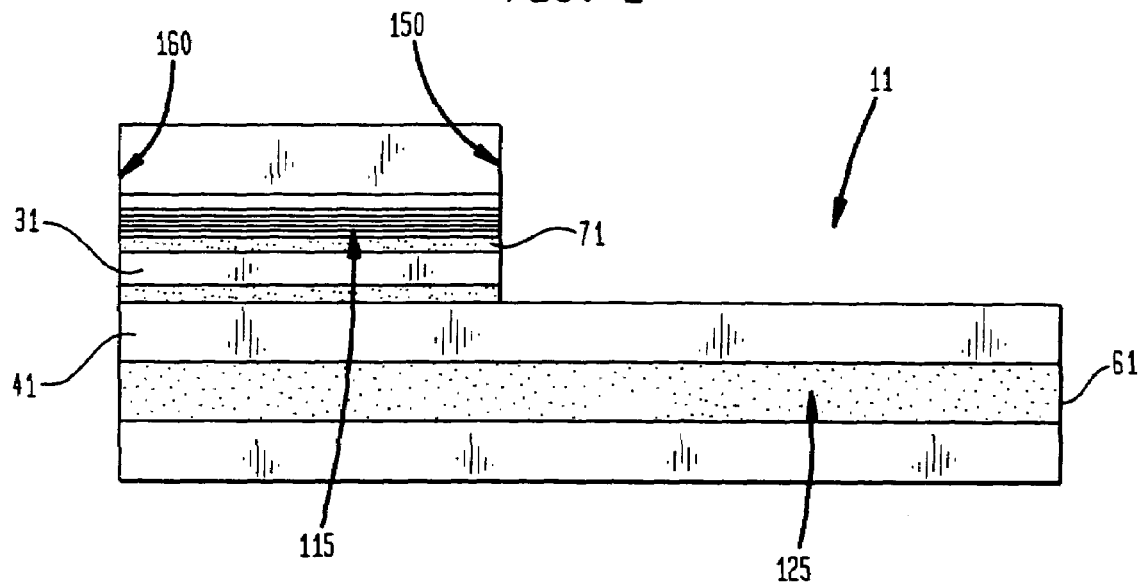
FIG. 2 is a schematic view of the ATG structure in accordance with the present

An illustrative embodiment of the invention is depicted schematically in FIG. 2. In the illustrated ATG structure 11, shown in vertical cross-section in the figure, two stacked waveguide layers 61 and 71 are separated by cladding layers 31 and 41. The active waveguide 71 incorporates multiple quantum wells 115 for high gain. For an exemplary embodiment, six such quantum wells are selected, and the active waveguide implements a laser and a TWA. Vertical facets 150 and 160 are formed in the active waveguide for the laser and the TWA. Passive region 61 incorporates a passive waveguide 125 for propagating light emitted from the active waveguide. The refractive indices and thickness of the waveguide layers are chosen to achieve a 30:70 ratio of confinement factors in the passive guide for the odd and even modes, respectively. The resulting quantum well confinement factors are 11% for the odd and 5% for the even mode.

Figure 3:
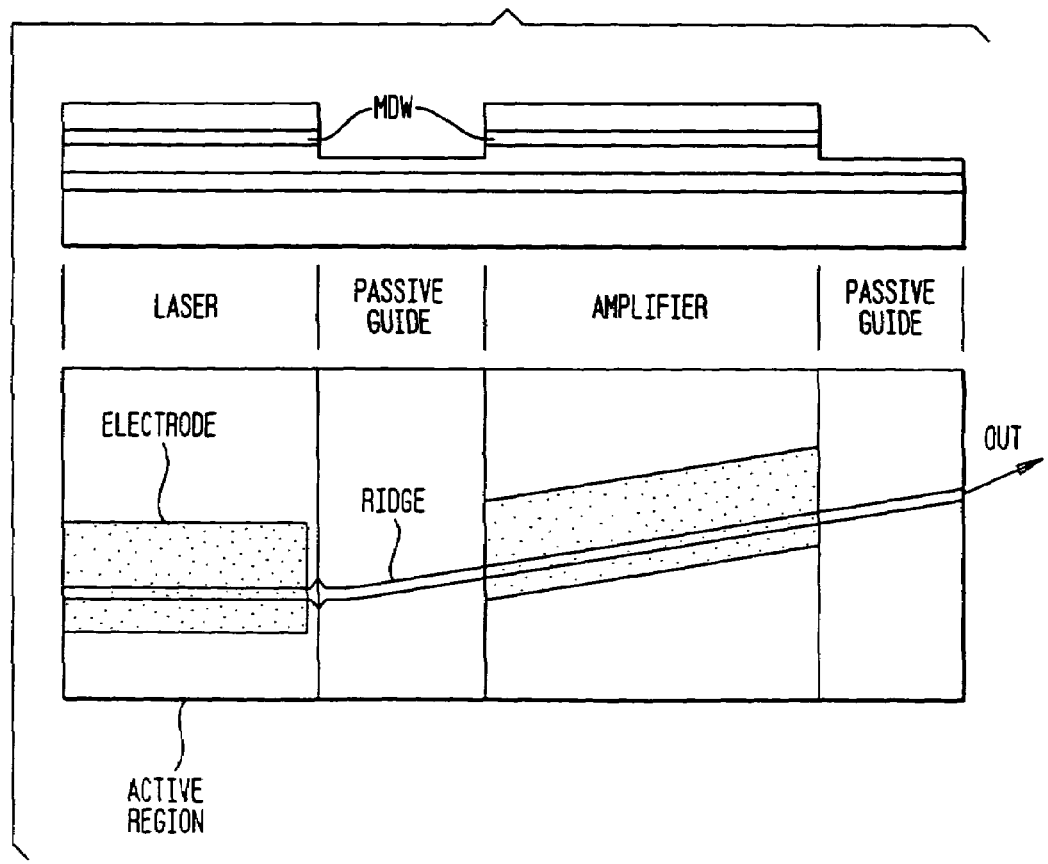
FIG. 3 shows a schematic view illustrative of device fabrication for the ATG structure of the present invention.

Fabrication of this illustrative ATG structure, which is depicted schematically in FIG. 3, is carried out using gas-source molecular beam epitaxy on an S-doped (100) n+ InP substrate. After epitaxial growth, active regions of the laser and TWA are masked using a 3000 Å thick layer of plasma-deposited $SiN_x$. The unmasked areas are etched to the bottom of the first waveguide using reactive ion etching in a $CH_4$:$7H_2$ plasma at 0.8 W/cm². This etch removes the upper waveguide layer and quantum wells from the passive regions of the device, and at the same time, forms the vertical facets (150 and 160 of FIG. 2) for the laser and TWA.

A second, 5 μm-wide $SiN_x$ mask is then used to define the ridge waveguide. This ridge (as shown in FIG. 3) runs perpendicular to the etched facet in the laser section, and is tilted at a 7° angle from the normal position at both TWA facets in order to prevent optical feedback into the amplifier. The ridge waveguide is formed by material-selective wet etching using a $1H_2SO_4$:$1H_2O_2$:$10H_2O$ for InGaAsP, and $3HCl$:$1H_3PO_4$ for InP. The ridge is about 3.8 μm wide, and supports a single lateral mode. The ridge height in the active and passive regions is different, controlled by two InGaAsP etch-stop layers. During the wet etching process, the dry-etched facets of the laser and TWA are protected by the ridge mask which is continuous on the vertical walls. Following deposition of the isolation $SiN_x$, the wafer is spin-coated with photoresist which is then etched in an $O_2$ plasma until the top of the ridge is exposed. The $SiN_x$ is then removed from the ridge, followed by the removal of the photoresist. In the next step, the p- and n-contacts are electron-beam deposited using Ti/Ni/Au (200/500/1200 Å) and Ge/Au/Ni/Au (270/450/215/1200 Å), respectively. Finally, the rear laser facet and the TWA output waveguide are cleaved.

With the ATG structure of the invention as heretofore described, the confinement factors for the two optical modes (odd and even) are split unequally between the active and passive waveguides. As a result, one of the modes is primarily confined to the passive waveguide and the other to the active waveguide. The mode which is contained primarily in the upper waveguide experiences higher gain and becomes dominant. Thus, the ATG structure provides a gain advantage, and generally higher stability, over a symmetric TG structure. However, the ATG structure also produces a relatively larger coupling loss than is experienced with the symmetric TG. While the higher gain for the ATG structure more than offsets this relative disadvantage in coupling loss, it would be desirable to provide an ATG structure with lower coupling loss. To that end, a further embodiment of the invention is disclosed herein which improves the efficiency of coupling power between the active to the passive waveguide and back in an ATG.

In particular, this further embodiment of the invention applies a lateral taper on the active waveguide to induce coupling between the active region and the adjacent passive region. This implementation drastically reduces coupling losses between the waveguide layers while retaining the absolute gain for the dominant mode in the active region. The performance of such an ATG combined with a taper on the active waveguide rivals the performance of devices previously possible only using complicated epitaxial regrowth processes.

Figure 4:
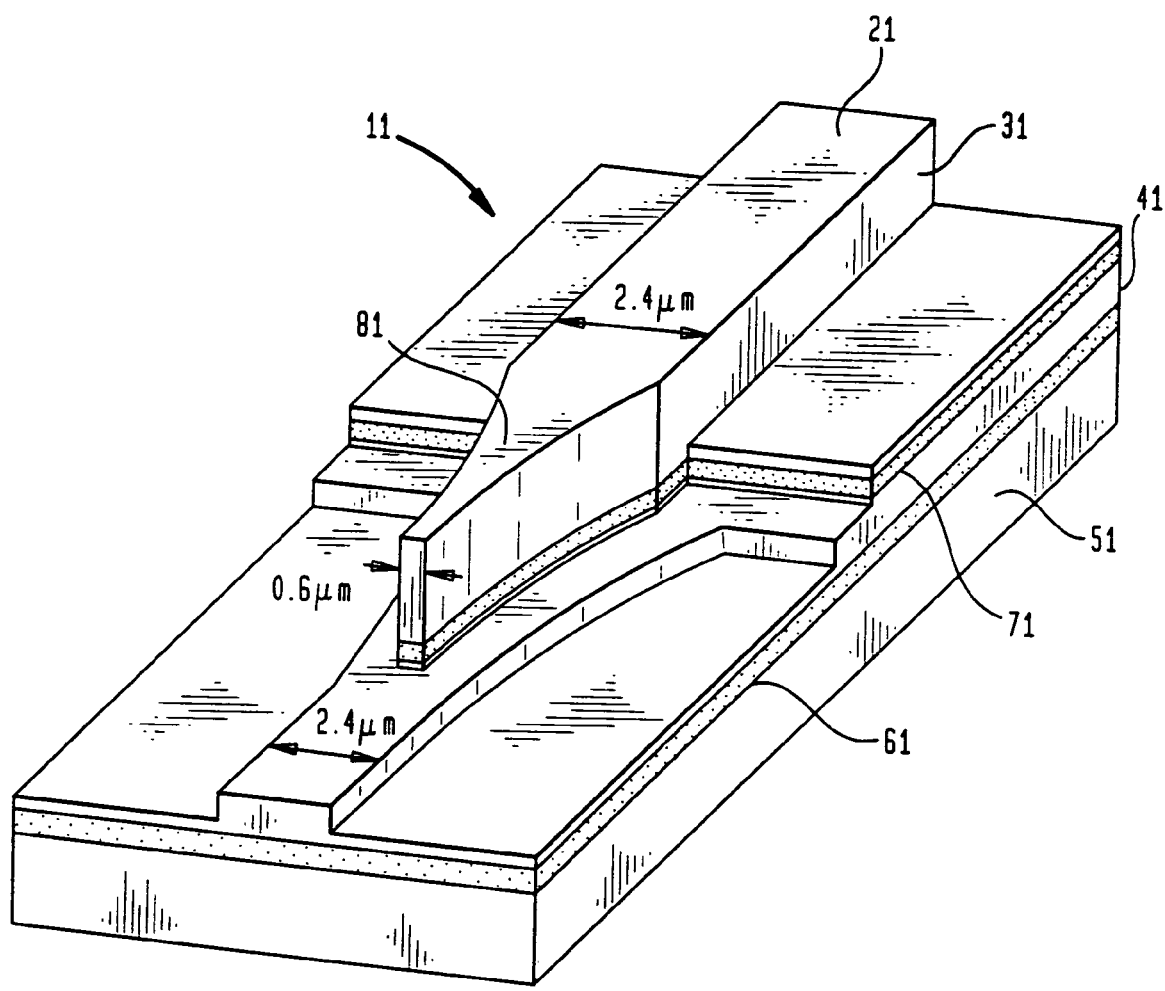
FIG. 4 is a three-dimensional schematic of the ATG structure including a taper coupler in accordance with the present invention.

Referring to FIG. 4, there is shown an exemplary embodiment of an ATG taper coupler in accordance with the invention. The exemplary ATG structure 11 of FIG. 4 incorporate a 2.4 μm wide shallow ridge waveguide in the upper active layer having an effective index higher than that of the lower passive layer. Hence, the even mode of propagation has a high confinement factor in the multiple quantum well active region. Under this condition, only the even mode of a Fabry-Perot laser will undergo significant gain. The coupling of this amplified mode into the passive layer at the end of the gain region is accomplished by increasing the etch depth of the waveguide ridge through the active layer to form a high-contrast lateral waveguide followed by a lateral taper region 81. For the exemplary embodiment, an exponential taper is used, which has a smaller mode transformation loss than a linear taper. It should, however, be understood that tapers of other shapes, as well as multi-section tapers, may be incorporated into the active waveguide and are within the contemplation of the invention.

At a tapered waveguide width of 1.1 μm for the exemplary embodiment, the effective indices of the two guides are matched and the power couples into the lower waveguide. As the taper narrows further, its effective index becomes smaller than that of the passive guide, in effect, locking the mode into the lower layer. This coupling arrangement is largely insensitive to small wavelength changes as long as the untapered ATG structure remains strongly asymmetric.

Fabrication of the exemplary ATG taper coupler is as follows: An InGaAsP passive waveguide 61 is first grown on a n+ doped (100) InP substrate 51. The passive waveguide 61 is 0.5 μm thick and has an energy gap cutoff wavelength of $\lambda_g$ of 1.2 µm. An InP cladding layer 41 of thickness 0.5 µm is followed by an InGaAsP active waveguide 71 with an energy gap cutoff wavelength of $\lambda_g$ of 1.20 µm. The active waveguide 71 incorporates six 135 Å thick, 1% compressively strained InGaAsP quantum wells separated by 228 Å barriers. An InP top cladding layer 31 is grown to a thickness of 1.2 µm and then a p+ InGaAsP contact layer 21 of 0.2 µm thickness is grown on top of the top cladding layer 31.

Once the basic twin-guide structure has been grown, a laser ridge waveguide with tapers at both ends is etched in a $CH_4/H_2$ (1:7) plasma at 0.8 W/cm$^2$ using a $SiN_X$ mask. The 1.2 µm high ridge terminates approximately 0.2 µm above the active waveguide. Next, a second, wide $SiN_X$ mask is added to cover the laser gain region but not the tapers. Etching is continued through the active waveguide defining the vertical walls of the taper and the etched facet, the latter being tilted at an angle of 7° from the waveguide longitudinal axis to prevent unwanted reflections. Next, the 700 nm high passive ridge is patterned and etched, extending 0.2 µm into the lower waveguide. After etching, a 3000 Å thick $SiN_X$ electrical isolation layer is deposited, followed by a Ti/Ni/Au (200/500/1200 Å) p-contact patterned using a self-aligned photoresist process. Finally, the wafer is thinned to approximately 100 µm and the Ge/Au/Ni/Au (270/450/215/1200 Å) n-contact is deposited and annealed at 360° C.

The inventors have empirically concluded that additional loss in the integrated devices due to the taper couplers is negligible. Empirical results also show that an ATG taper coupler with integrated lasers with $L_A$=2.05 mm produced output powers ≦ approximately 35 mW with 24% slope efficiency per facet. Imaging the facets with an infrared video camera clearly shows that almost all of the power is emitted from the waveguide, with very little light scattered from the tapered region.

In a further embodiment, a grating region is incorporated atop the passive waveguide. The grating region can be conventionally etched or formed on the passive waveguide and can be shaped with triangular peak or can be sinusoidal or rectangular in shape with repeating patterns. The grating region is used to select certain frequencies for transmission of light through the passive waveguide. By selectively adjusting the period of the grating region, the frequency to be reflected can be selected.

The invention can also be embodied in other integrated devices, using lasers and TWAs as the active components, interconnected by waveguides formed in passive layers using tapers at each active-to-passive junction providing low-loss optical coupling of light between adjacent sections.

CONCLUSION

A monolithically integrated InGaAsP/InP MQW laser and optical amplifier are disclosed herein, using a novel, asymmetric twin-waveguide (ATG) structure which uses gain to select one of the two propagating modes. The ATG structure can be effectively utilized with a traveling-wave amplifier (TWA), where performance up to 17 dB internal gain and low gain ripple can be obtained.

The ATG structure differs from the prior art symmetric twin waveguide structure in that the two optical modes are split unequally between the active and passive waveguides. This is achieved by varying the effective index of the waveguides slightly from that required by the symmetric mode condition. As a result, one of the modes is primarily confined to the passive waveguide. The mode with the larger confinement factor in the active waveguide experiences higher gain and becomes dominant. A smaller coupling ratio for the dominant mode compared to that in the symmetric structure is offset by higher gain for that mode due to its confinement factor of the active region therein which is larger than that of the symmetric TG.

The ATG structure of the invention uses a single material growth step, followed by dry and wet etching steps to delineate the active and passive devices in the upper and lower waveguides of the TG structure.

In a further embodiment, the ATG structure of the invention is integrated with a taper coupler to retain the higher gain possible with an ATG while reducing the coupling losses between the active and passive devices made from the ATG structure.

Although the present invention is described in various illustrative embodiments, it is not intended to limit the invention to the precise embodiments disclosed herein. Accordingly, this description is to be construed as illustrative only. Those who are skilled in this technology can make various alterations and modifications without departing from the scope and spirit of this invention. Therefore, the scope of the present invention shall be defined and protected by the following claims and their equivalents. The exclusive use of all modifications within the scope of the claims is reserved.

We claim:

1. A monolithically integrated optical circuit comprising:
   an active region for emitting light, said active region formed in a first layer of the optical circuit; and
   a passive region for propagating said light, said passive region coupled to said active region and formed in a second layer of the optical circuit;
   wherein said active region has a first effective index of refraction and said passive region has a second effective index of refraction, said first effective index of refraction and said second effective index of refraction having values causing a first mode of light to propagate primarily in said active region and a second mode of light to propagate primarily in said passive region, and
   wherein a first optical device is formed in said active region, a second optical device is formed in said active region, and said passive region communicates light between said first optical device and said second optical device.

2. An integrated optical circuit according to claim 1, further comprising a layer positioned between said active region and said passive region, said layer having a lower index of refraction than said active region and said passive region, and allowing for coupling of light between said active region and said passive region.

3. An integrated optical circuit according to claim 1, wherein said first effective index of refraction has a value causing the first mode to be primarily confined to said active region and said second effective index of refraction has a value causing the second mode to be primarily confined in said passive region.

4. An integrated optical circuit according to claim 1, wherein said first effective index of refraction and the second effective index of refraction have values causing approximately 70% or more of one of said first and second modes to be confined to the active region.

5. An integrated optical circuit according to claim 1, wherein said first optical device comprises a first waveguide formed in said active region, said second optical device has a second waveguide formed in said active region, and said passive region has a third waveguide formed therein for guiding light between the between said first and second waveguides.

6. An integrated optical circuit according to claim 5, wherein said first waveguide comprises a lateral taper at its junction with the third waveguide, and said second waveguide includes a lateral taper formed at its junction with the third waveguide.

7. An integrated optical circuit according to claim 6, wherein said lateral tapers follow exponential curves.

8. An integrated optical circuit according to claim 5, wherein said first waveguide and said second waveguide are shallow ridge waveguides and have effective indices of refraction higher than the third waveguide.

9. An integrated optical circuit according to claim 1, wherein said first optical device is a laser.

10. An integrated optical circuit according to claim 9, wherein said laser is driven by at least one quantum well.

11. An integrated optical circuit according to claim 9, wherein said second optical device is a semiconductor optical amplifier.

12. An integrated optical circuit according to claim 11, wherein said semiconductor optical amplifier is a travelling-wave optical amplifier.

13. An integrated optical circuit according to claim 1, wherein said passive region comprises a grating region for reflecting selected frequencies of light from said active region.

14. An integrated optical circuit according to claim 1, wherein said passive region comprises a third optical device.

15. An integrated optical device according to claim 14, wherein said third optical device operates on light communicating between said first optical device and said third optical device.

* * * * *